United States Patent
Behlen et al.

(12) 
(10) Patent No.: US 6,534,392 B1
(45) Date of Patent: Mar. 18, 2003

(54) METHODS OF MAKING MICROELECTRONIC ASSEMBLIES USING BONDING STAGE AND BONDING STAGE THEREFOR

(75) Inventors: Jim Behlen, Sunnyvale, CA (US); Philip Damberg, Cupertino, CA (US); Rene Kunz, Mountain View, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/952,140

(22) Filed: Sep. 14, 2001

(51) Int. Cl.[7] .............................................. H01L 21/44
(52) U.S. Cl. ...................................................... 438/617
(58) Field of Search ................................ 438/617, 106, 438/108, 118

(56) References Cited

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,548,884 A * | 8/1996 | Kim | 29/593 |
| 5,659,952 A | 8/1997 | Kovac et al. | 29/840 |
| 5,679,977 A | 10/1997 | Khandros et al. | 257/692 |
| 5,777,379 A | 7/1998 | Karavakis et al. | 257/668 |
| 5,966,630 A * | 10/1999 | Yoshiyama | 438/612 |
| 6,159,770 A * | 12/2000 | Tetaka et al. | 438/112 |

FOREIGN PATENT DOCUMENTS

WO    WO 94/03036    2/1994

* cited by examiner

Primary Examiner—David Nelms
Assistant Examiner—Quoc Hoang
(74) Attorney, Agent, or Firm—Lerner, David, Littenberg, Krumholz & Mentlik, LLP

(57) ABSTRACT

A method of making a microelectronic assembly comprises connecting a lead to a contact on a microelectronic element and to a stage. The microelectronic element is juxtaposed with a microelectronic component and the lead is disconnected from the stage. The lead is bonded to a terminal pad on the microelectronic component. A stage for making a microelectronic assembly has a conduit for introducing a bonding tool toward a lead bonded to the stage and extending across the conduit while the microelectronic element is juxtaposed with the microelectronic component.

27 Claims, 9 Drawing Sheets

METHODS OF MAKING MICROELECTRONIC ASSEMBLIES USING BONDING STAGE AND BONDING STAGE THEREFOR

FIELD OF THE INVENTION

The present invention relates to methods of making microelectronic assemblies such as semiconductor chip packages.

BACKGROUND OF THE INVENTION

Modern electronic devices utilize semiconductor chips, commonly referred to as "integrated circuits" which incorporate numerous electronic elements. These chips are mounted on substrates that physically support the chips and electrically interconnect each chip with other elements of a circuit. The substrate may be a part of a chip package including a single chip and equipped with terminals for interconnecting the chip with external circuit elements. The interconnection between the chip and its supporting substrate is commonly referred to as a "first level" interconnection. The interconnection between the substrate and the larger elements of the circuit is commonly referred to as a "second level" interconnection.

In a wire bonding process, the substrate has a top surface with a plurality of electrically conductive contact pads disposed on the top surface near the periphery of the substrate. The chip is secured to the top surface of the substrate so that the contact pads on the substrate lie outwardly of the chip. The chip is mounted with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate.

Semiconductor chip assemblies may also utilize a component having bond windows for making electrical connections between terminals on the component and contacts on a semiconductor chip. Such a component is disclosed in certain embodiments of WO 94/03036, the disclosure of which is hereby incorporated by reference herein. The component comprises a layer having a gap and leads extending across the gap so that the leads are supported at both ends. The component is disposed on top of a semiconductor chip so that the leads generally extend over the contacts of the chip. A bonding tool is utilized to bond each lead to a contact on the chip, by advancing the tool toward a lead and forcing the lead toward the contact on the chip. The lead may include a frangible section that breaks when the lead is forced toward the contact. Heat and/or ultrasonic vibration is applied to the lead by the tool so as to bond the lead to the contact. Prior to bonding to a semiconductor chip, the leads are secured to the component and somewhat protected during handling of the component and arranging of the component with the semiconductor chip. However, a bonding window is required to provide access to the contacts.

Despite the foregoing improvements, further advancement in making microelectronic assemblies is desirable.

SUMMARY OF THE INVENTION

The present invention addresses these needs.

In one aspect of the present invention, a method of making a microelectronic assembly comprises connecting a first end of a lead to a contact on a microelectronic element. A second end of the lead is connected to a stage disposed adjacent to the microelectronic element. The microelectronic element is juxtaposed with a microelectronic component having terminal pads exposed at a first side of the microelectronic component. The lead is disconnected from the stage, either before or after juxtaposing the microelectronic element with the microelectronic component. The lead is bonded to one of the terminal pads on the microelectronic component.

Methods in accordance with embodiments of the invention interconnect a microelectronic element with a microelectronic component without the use of a bond window for accessing the leads. In addition, the leads may remain bonded to the stage during some or all of the handling of the microelectronic element and are thus supported during handling, making damage to the leads less likely. Components having bond windows must have bond windows aligned with the contacts on the microelectronic element to be assembled with the component. In a method in accordance with embodiments of the invention, microelectronic elements of different sizes and having contacts in different locations may be accommodated.

In preferred embodiments, the lead comprises a wire formed by wire bonding a first end of the wire to the contact on the microelectronic element, extending the wire past a peripheral edge of the microelectronic element, and bonding a second end of the wire to the stage. The microelectronic element is preferably mounted to the stage and juxtaposed with the microelectronic component by moving the stage to the microelectronic component. The microelectronic element preferably has a first surface and a second surface facing oppositely from the first surface and the contacts are exposed at the first surface. The microelectronic element is preferably juxtaposed with the microelectronic component so that the first surface faces the first side of the microelectronic component, so that the contacts on the microelectronic element face the terminals on the microelectronic component.

In embodiments having the wires bonded to the stage while the microelectronic element is juxtaposed with the microelectronic component, the wires are supported during handling and arranging the microelectronic element with the microelectronic component. When the microelectronic element is juxtaposed with the component so that the contacts on the microelectronic element face the component, the wires may be shorter than in other embodiments and performance of the completed assembly is enhanced.

In other embodiments, the microelectronic element is juxtaposed with the microelectronic component so that the second surface of the microelectronic element faces the first side of the microelectronic component. In this embodiment, the contacts on the microelectronic component face away from the component.

The microelectronic element is preferably assembled with the microelectronic component. At least one pad element is preferably assembled with the microelectronic element and the microelectronic component so that the at least one pad element is disposed between the microelectronic element and the microelectronic component. The at least one pad element may comprise a compliant pad element.

The microelectronic element may comprise at least one semiconductor chip, a temporary support layer, a sacrificial layer, a connection component, a printed circuit board, a wafer or tape of semiconductor chips, or a substrate. The microelectronic component may comprise a semiconductor chip, a printed circuit board, temporary support layer, a sacrificial layer, a connection component, a substrate, or a wafer or tape of semiconductor chips, and may incorporate a variety of conductive features on surfaces thereof or incorporated within the component.

Methods in accordance with embodiments of the present invention may comprise making the microelectronic component by forming the terminal pads on a first side of a dielectric layer, forming conductive traces on the first side, and forming connection terminals on a second side of the dielectric layer so that the terminal pads are electrically connected to the connection terminals by the conductive traces. Solder may be applied at the second side of the dielectric layer to form the connection terminals.

The lead is preferably disconnected from the stage by severing a portion of the lead connected to the contact from another portion of the lead connected to the stage. The bonding of the lead to the terminal pad may include displacing the lead in a direction toward the terminal pad utilizing a bond tool.

The lead, in other preferred embodiments, is releasably connected to the stage and disconnected from the stage by removing the microelectronic element from the stage. For example, the lead may be connected to an upper surface of the stage and the upper surface may comprises a non-stick surface.

In certain preferred embodiments, the stage has a first surface and includes a conduit being open on the first surface. The second end of the lead is bonded to the first surface so that the lead extends over the conduit. The lead may be disconnected by inserting a cutting tool into the conduit and severing a portion of the lead connected to the contact from another portion of the lead connected to the stage. The lead is preferably bonded to the terminal pad by inserting a bonding tool into the conduit, displacing the lead in a direction toward the terminal pad and bonding the lead to the terminal pad.

In another aspect of the present invention, a method of making a microelectronic assembly comprises connecting a first end of a wire to a contact on a microelectronic element having peripheral edges. The wire is extended beyond the peripheral edges of the microelectronic element. A second end of the wire is bonded to a stage disposed adjacent to the microelectronic element. The microelectronic element is assembled with a microelectronic component having a first side and a second side. The microelectronic component has terminal pads exposed at the first side and connection terminals exposed at the second side. Each connection terminal is electrically connected to one of the terminal pads. The wire is disconnected from the stage, either before or after the assembling. The wire is bonded to one of the terminal pads.

At least one pad element is preferably assembled with the microelectronic element and the microelectronic component so that the at least one pad element is disposed between the microelectronic element and the microelectronic component. The at least one pad element preferably comprises a compliant pad element.

The microelectronic element may comprise at least one semiconductor chip.

The wire is preferably disconnected from the stage by severing a portion of the wire connected to the contact from another portion of the wire connected to the stage.

In certain preferred embodiments, the stage has a first surface and includes a conduit open on the first surface. The second end of the wire is bonded to the first surface so that the wire extends over the conduit. The wire is bonded to the terminal pad by inserting a bonding tool into the conduit, displacing the wire in a direction toward the terminal pad and bonding the wire to the terminal pad.

Preferably, the microelectronic element is mounted to the stage and the microelectronic element is juxtaposed with the microelectronic component by moving the stage to the microelectronic component.

In a further aspect of the present invention, a stage for making a microelectronic assembly comprises a base arranged to hold a microelectronic element during positioning of the microelectronic element with respect to a microelectronic component. The stage has walls extending upwardly from the base and terminating in an upper surface. The walls define a conduit that is open at the upper surface. A bonding tool is arranged to be introduced toward a lead extending across the conduit at the upper surface and to apply energy in bonding the lead to a pad on a microelectronic component.

The base of the stage may define vacuum holes for holding the microelectronic element. In another alternative, the stage has a clamp for holding the microelectronic element.

The stage may include a cutting tool for separating from the stage a lead bonded to the upper surface. The cutting tool is preferably arranged to be introduced toward the lead through the conduit.

BRIEF DESCRIPTION OF THE DRAWINGS

These and other features, aspects and advantages of the present invention will become better understood with regard to the following description, appended claims, and accompanying drawings where:

DETAILED DESCRIPTION

Figure 1:
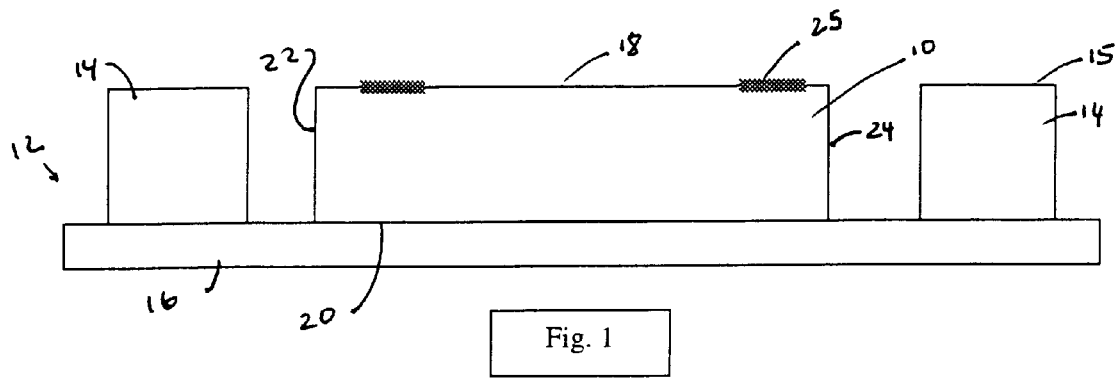
FIG. 1 is a schematic, cross-sectional view of a microelectronic element disposed in a stage in a method in accordance with an embodiment of the invention.

A method in accordance with an embodiment of the invention is shown in FIGS. 1–10. A microelectronic element, which may comprise a semiconductor chip 10, is supported on a stage 12 having one or more walls 14 surrounding the chip 10 and a base 16 for supporting the chip 10. The walls 14 extend upwardly from the base 16 and terminate in an upper surface 15 disposed adjacent the chip 10. In preferred embodiments, the walls 14 have a height approximately equal to the height of the chip 10 so that leads to be connected to the chip are no longer than necessary. The chip 10 has a first surface 18 and a second surface 20 facing oppositely from the first surface 18. The chip 10 has four peripheral edges extending between the first surface 18 and second surface 20. As FIG. 1 is a cross-sectional view, only the first peripheral edge 22 and the second peripheral edge 24 are shown. Contacts 25 are exposed at the first surface 18, which faces upwardly away from the base 16 of the stage 12. The chip 10 shown in FIG. 1 has contacts arranged in two rows alongside the first peripheral edge 22 and second peripheral edge 24. However, microelectronic elements having contacts arranged in any number of patterns may be used in embodiments in accordance with the invention. The second surface 20 of the chip 10 rests upon the base 16. The contacts 25 may comprise contacts of copper, gold, aluminum, or alloys of these metals.

Figure 2:
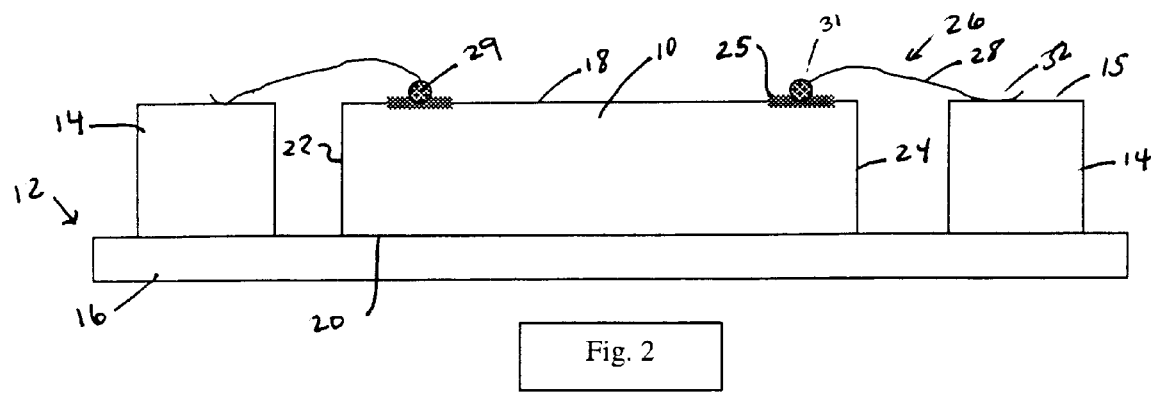
FIG. 2 is the cross-sectional view of FIG. 1, at a later stage in the method.

As shown in FIG. 2, leads 26 are connected to the contacts 25, preferably using wire bonding techniques. Such techniques are well known in the art of making semiconductor chip assemblies. A wire bonding tool is utilized to hold a first end 31 of a wire 28 against the contact 25 and bonding energy is applied to bond the wire 28 to the contact 25. The bonding energy may comprise either thermocompression, ultrasonic, or thermosonic energy. The wire bonding tool has a wire feed hole through which the wire is dispensed. After bonding the wire 28 to the contact 25, the wire bonding tool is withdrawn and moved towards the upper surface 15. As the tool is moved, the wire 28 is dispensed from the feed hole. The wire bonding tool is then used to bond the wire 28 to the upper surface 15 of the walls 14 of the stage 12, by holding the wire against the upper surface and applying bonding energy. The remaining wire in the wire bonding tool is separated from the wire 28 extending between the contact 25 and the upper surface 15 of the stage 12 by breaking or flaming off the wire so that a second end 32 of the wire 28 remains bonded to the stage. This cycle may be reversed so that the wire is first bonded to the stage 12 and then bonded to the contact 25 on the chip 10. Before bonding to the contact 25, the wire bonding tool may be used to form a ball 29 of wire material which is bonded to the contact 25. The wire may comprise any material suitable for making an electrically conductive connection. For example, the wire material may comprise gold, gold alloys, or aluminum alloys. The wire 28 is preferably flexible.

Figure 3:
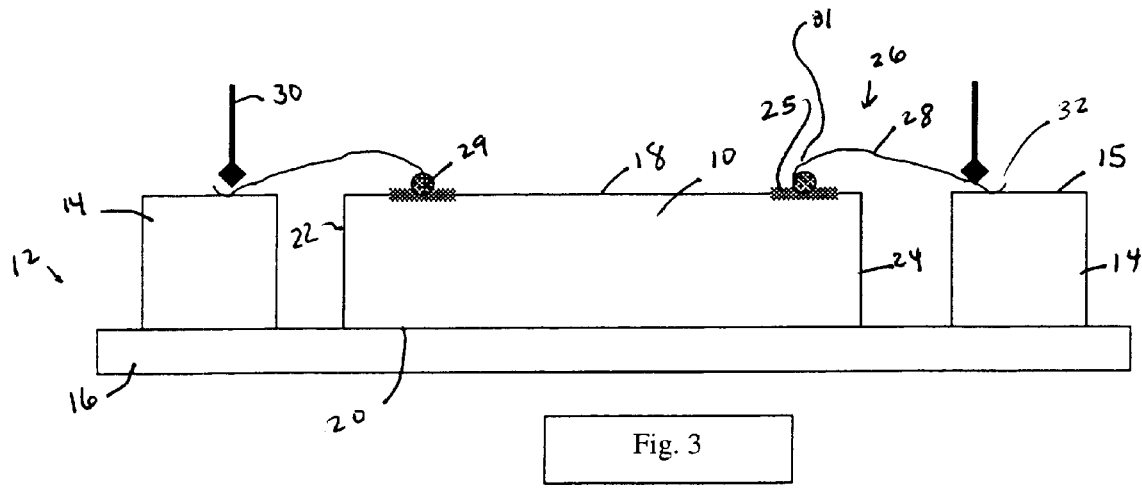
FIG. 3 is the cross-sectional view of FIG. 2, at a later stage in the method.
Figure 4:
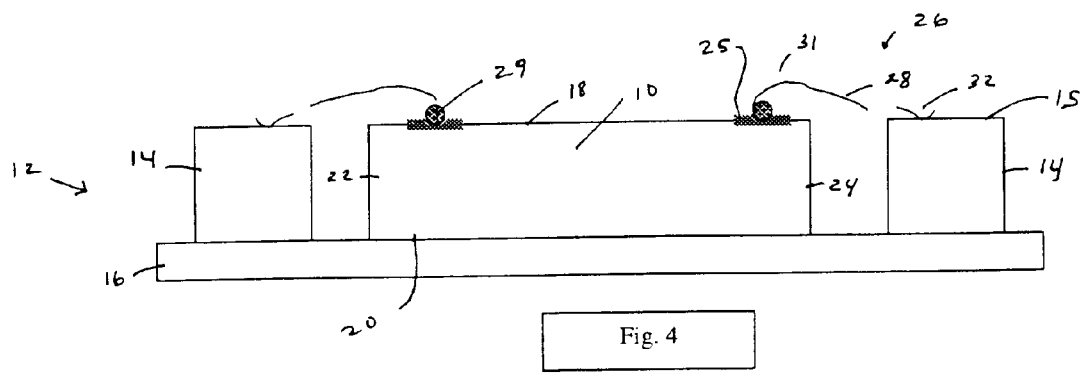
FIG. 4 is the cross-sectional view of FIG. 3, at a later stage in the method.

As shown in FIGS. 3 and 4, a cutting tool 30 is utilized to separate the wire 28 from the stage 12 by severing the wire 28. The cutting tool may comprise: a series of cutting tools, each tool cutting an individual wire 28; a pair of cutting tools, each tool cutting the wires 28 connected to contacts 25 adjacent one peripheral edge of the chip 10; or a single tool. The cutting tool may comprise a blade or a scissor-like pair of blades. After the wire 28 is cut, the wire remains connected to a contact 25 at the first end 31 and has a free, unconnected end.

Figure 5:
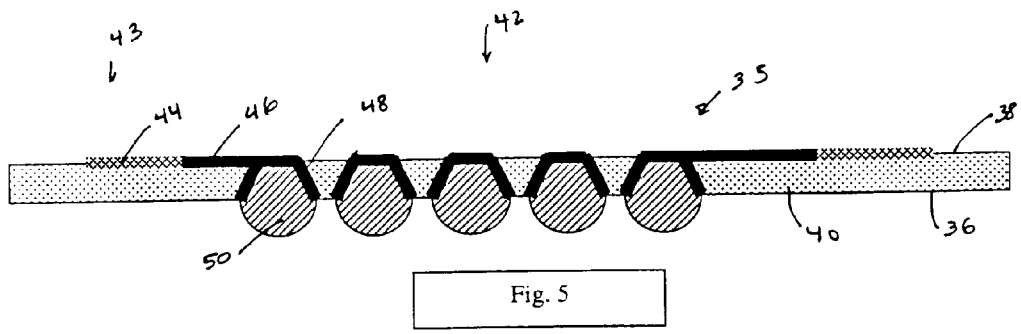
FIG. 5 is a schematic, cross-sectional view of a microelectronic component in a method in accordance with the embodiment of FIGS. 1–4.
Figure 6:
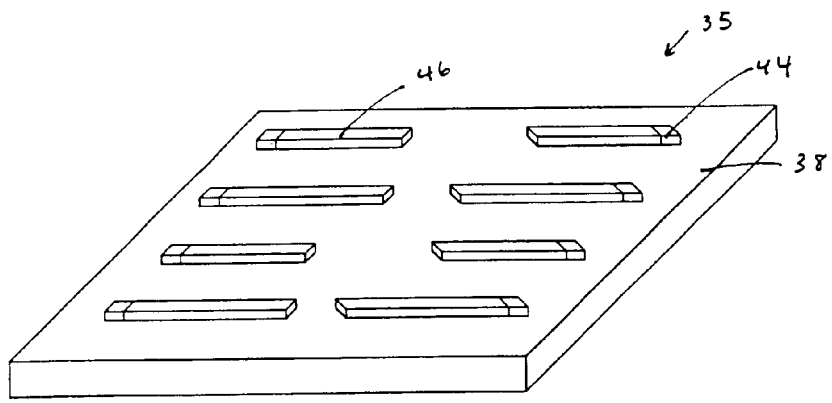
FIG. 6 is a schematic, top right perspective view of the microelectronic component of FIG. 5.

A microelectronic component, such as a connection component used to make semiconductor chip packages, is formed. An example of a microelectronic component that may be used in embodiments of the invention is shown in FIG. 5. The component 35 shown in FIG. 5 may be formed by providing a dielectric layer 36 having a first side 38 and a second side 40 facing oppositely from the first side. The dielectric layer may comprise a layer of polyimide and is preferably a flexible layer. The dielectric layer 36 has a central region 42 and a peripheral region 43 surrounding the central region 42 and extending to edges of the dielectric layer 36. Terminal pads 44 are formed on the dielectric layer 36 so that the terminal pads 44 are exposed at the first side 38 in the peripheral region 43 of the dielectric layer. Conductive traces 46 are formed so that they are connected to the terminal pads 44 and extend on the first side 38 of the dielectric layer to vias 48. (FIG. 6). Any of the methods for forming such conductive features that are well known in the microelectronic and/or semiconductor fields may be used. For example, the terminal pads 44 and traces 46 may be formed by photolithographic techniques. In other embodiments, the traces 46 are incorporated within the dielectric layer 36 or extend on the second side 40. Other conductive features, such as power planes or ground planes may be incorporated within dielectric layer 36 and dielectric layer 36 may comprise a plurality of layers.

Vias 48 are formed so that they extend from the first side 38 to the second side 40 of the dielectric layer and are lined and/or filled with an electrically conductive material so as to form an electrical connection between the traces 46 on the first side 38 and connection terminals 50 exposed at the second side 40. The vias essentially comprise holes through the dielectric layer 36 and may be made by cutting the dielectric layer with a laser, or by any of the methods known in the microelectronic and/or semiconductor fields. The vias 48 are bounded by walls of the dielectric layer formed in cutting the dielectric layer 36. The vias 48 are lined with an electrically conductive material by seeding the walls of the dielectric layer 36 in the vias 48 with an electrically conductive material, as is well known. Preferably, electrically conductive annular pads surrounding the vias are formed at the second side 40 of the dielectric layer 36. The annular pads may also be formed utilizing photolithographic techniques. The terminal pads 44, traces 46 and conductive material for the vias 48 may comprise any conductive material suitable for electronic components. These conductive features may comprise copper, gold, alloys of these metals, or conductive polymers.

The connection terminals 50 may include solder disposed in the vias 48 or otherwise applied at the second side 40 of the dielectric layer 36. Solder balls may be applied to the vias 48, at the annular pads, and reflowed so that the solder flows into the vias 48 and forms a bulging, dome-shaped terminal 50 exposed at the second side 40 of the dielectric layer 36. Other methods of forming such terminals are known. For example, a solder paste may be applied at the second side 40. The connection terminals 50 and vias 48 are formed so that the terminal pads 44, exposed at the first side 38, are connected to the connection terminals 50, exposed at the second side 40, through the traces 46.

The connection terminals 50 are used in forming connections between the chip 10 and other microelectronic elements, such as a printed circuit board or substrate.

The chip and component shown in the figures may include many more contacts, terminal pads, connection terminals and traces than are shown, as the Figures are schematic views and show only a few such features, for ease of illustration.

Figure 7:
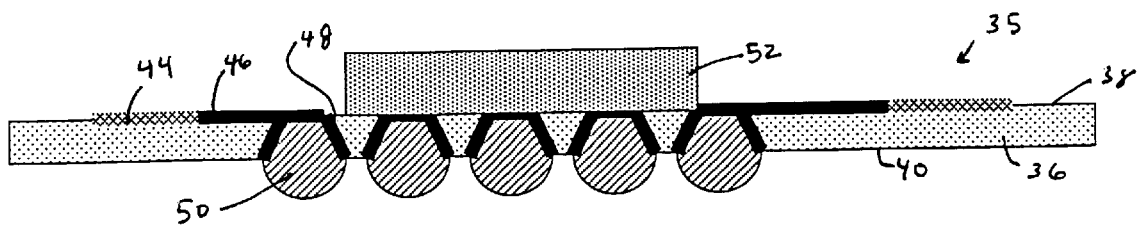
FIG. 7 is the cross-sectional view of FIG. 5, at a later stage in the method.
Figure 8:
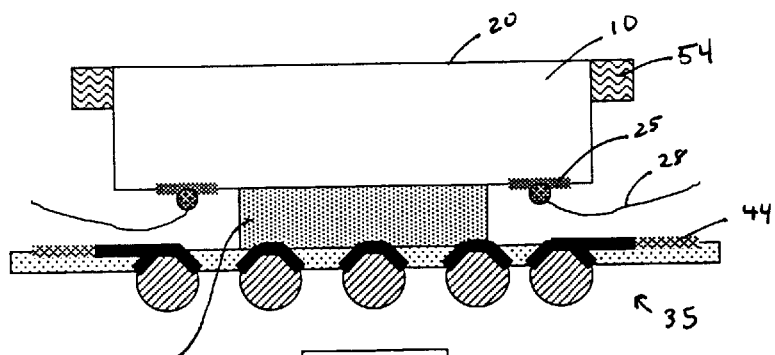
FIG. 8 is a schematic, cross-sectional view of a microelectronic component and microelectronic element in a method in accordance with the embodiment of FIGS. 1–7.

A pad element 52 is attached to the microelectronic component 35, as shown in FIG. 7. The pad element 52 preferably comprises a pad of compliant material, such as that disclosed in certain embodiments of U.S. Pat. No. 5,679,977, the disclosure of which is hereby incorporated by reference herein. The pad element may be formed in place on the component 35, or on the chip 10, or otherwise disposed therebetween. The pad element may be formed by screen printing a curable liquid elastomer gel onto a surface of the component 35 or chip 10 and then curing the elastomer to form a compliant layer. The pad element may also comprise a preformed element that is adhered to the component 35 or the chip 10.

In other preferred embodiments, a plurality of pad elements are disposed on or otherwise interposed between the microelectronic component and the microelectronic element. Such pad elements may be as disclosed in certain embodiments of U.S. Pat. No. 5,659,952, the disclosure of which is hereby incorporated by reference herein.

The component 35, pad element 52 and chip 10 are juxtaposed with one another and assembled together. The chip 10 is juxtaposed with the pad element 52 and component 35 utilizing a pick and place machine, or other robotic equipment for handling microelectronic parts. The pick and place machine engages the chip 10 using a clamp 54, which may use either a mechanical clamping force or vacuum to hold the chip 10 in place during handling. The pick and place machine moves the clamp 54 so as to orient the chip 10 to the position shown in FIG. 8, relative to the component 35. The chip 10 is placed upon, and preferably adhered to, a face of the pad element 52 while the component 35 is supported on a surface or platen. Preferably, such surface or platen for supporting the component 35 has a groove for accommodating the connection terminals 50 while supporting the component 35 by the dielectric layer 36. The pick and place machine may be used to apply pressure necessary for curing or activating any adhesive that may be used to adhere the chip 10 to the pad element 52. The chip 10 is placed on the pad element 52 so that the wires 28 are positioned above the terminal pads 44. Preferably, the terminal pads 44 are relatively large in comparison to the wires 28 so that minor errors in placing the chip 10 with respect to the component 35 do not affect the ability to bond the wires 28 to the terminal pads 44. Automatic pattern recognition or robotic vision equipment known in microelectronic manufacturing and other fields is preferably used to position the chip 10 on the component 35 so that the wires 28 are aligned with the terminal pads 44.

Preferably, the pick and place machine is arranged to handle a plurality of chips and assemble a plurality of chips with a plurality of components or a substrate incorporating a plurality of individual component regions. The individual component regions may later be separated in singulation of individual chip packages. In singulation, the component regions are essentially severed from one another.

Figure 9:
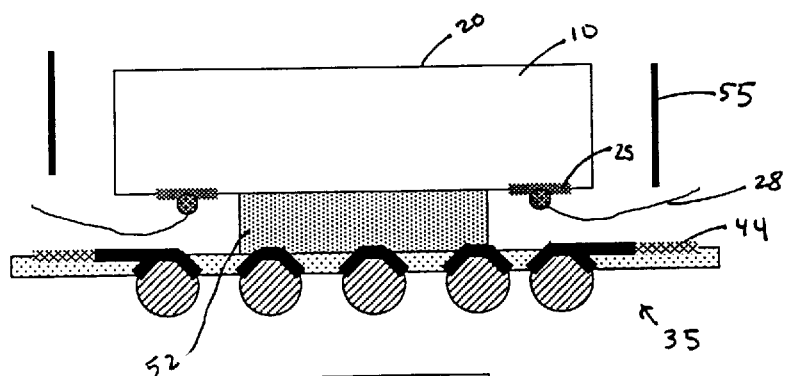
FIG. 9 is the cross-sectional view of FIG. 8, at a later stage in the method.
Figure 10:
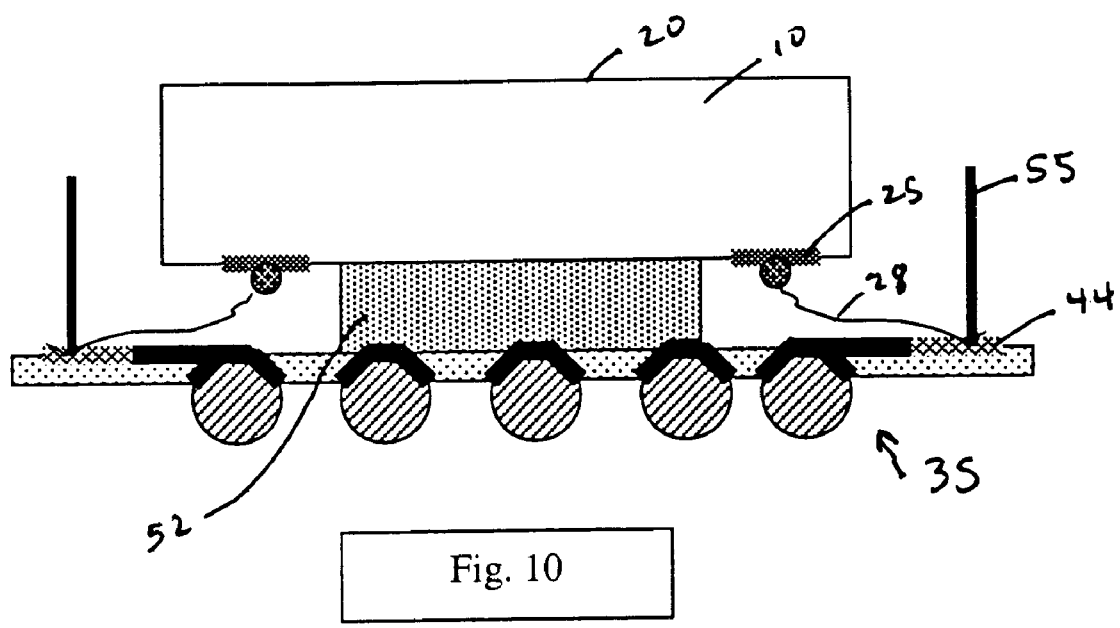
FIG. 10 is the cross-sectional view of FIG. 9, at a later stage in the method.
Figure 11:
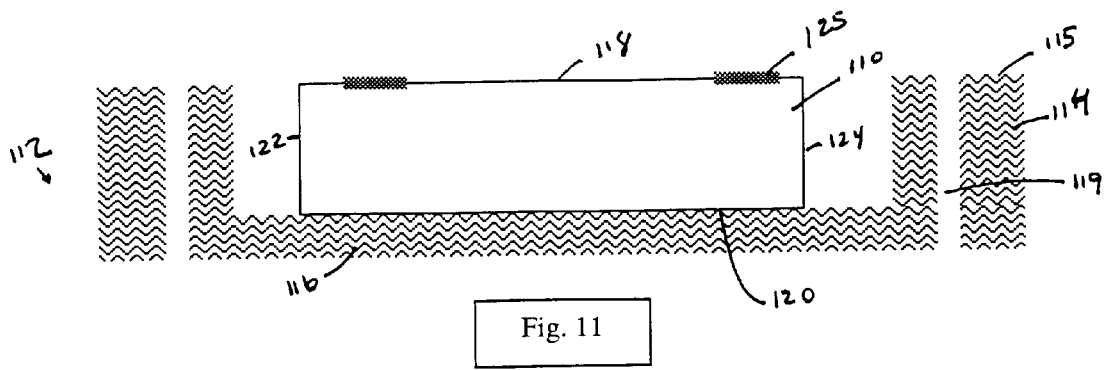
FIG. 11 is a schematic, cross-sectional view of a microelectronic element disposed in a stage in a method in accordance with another embodiment of the invention.

The wires 28 are bonded to the terminal pads 44, as shown in FIGS. 9 and 10. A bonding tool 55 is utilized to displace the wires 28 toward a terminal pad 44, engage the wires 28 with the terminal pads 44, and apply energy to bond the wires 28 to the terminal pads 44. The bonding tool 55 is preferably arranged to apply heat and/or ultrasonic vibration to bond the wires 28 to the terminal pads 44. Preferably, the bonding tool 55 comprises a bonding tool similar to that disclosed in certain embodiments of WO 94/03036, the disclosure of which is hereby incorporated by reference herein. The bonding tool 55 engages each wire 28 and bonds the wire 28 to the terminal pad 44, one at a time. The tool 55 advances to the next wire 28 and can bond all the wires 28 on a series of chips 10 quickly enough for a commercial operation on large numbers of chips. In other embodiments, gang bonding may be used, in which a series of wires 28 are bonded to terminal pads 44 at the same time.

The bonding tool 55 preferably has features that engage the wires 28 and encourage correct positioning of the wires with respect to the terminal pads 44. For example, the bonding tool may have grooves for engaging and adjusting the position of the wires 28. Automatic pattern recognition and positioning equipment known in the microelectronic manufacturing and other fields may be used in operating the bonding tool 55 so as to engage the wires 28 and bond them to the terminal pads 44.

Preferably, the assembly is encapsulated to protect the wires and the connections between the contacts, wires, and terminal pads. The assembly may be encapsulated by engaging the assembly between two platens or placing the assembly in a fixture and introducing a flowable, curable dielectric material so that the material invades the spaces around the wires 28 and between the chip 10 and component 35. Preferably, the encapsulant material is curable to a compliant material so that compliant or flexible materials used, such as flexible leads, remain flexible.

Preferably, the assembly is formed so that the connection terminals move relative to the contacts on the chip, as disclosed in certain embodiments of U.S. Pat. No. 5,679,977, the disclosure of which is hereby incorporated by reference herein. The dielectric layer of the microelectronic component and the pad element may comprise flexible or compliant materials. In bonding the wires to the terminal pads of the microelectronic component, a support structure, such as those disclosed in certain embodiments of U.S. Pat. No. 5,777,379, the disclosure of which is hereby incorporated by reference herein, may be used to support the dielectric layer.

Another embodiment of the invention is shown in FIGS. 11–16. Many of the steps and elements in this embodiment may be as discussed above in connection with FIGS. 1–10 and elements shown in FIGS. 11–16 have reference numerals corresponding to similar elements of FIGS. 1–10. The microelectronic element, which may comprise a semiconductor chip 110, is placed in a stage 112. The stage 112 comprises a fixture having walls 114 that extend upwardly from a base 116. The walls 114 have an upper surface 115 that is disposed adjacent the first surface 118 of the chip. Contacts 125 of the chip 110 are exposed at the first surface 118.

The stage 112 has conduits 119 that are open at the upper surface 115 of the walls 114. The stage has a clamp for engaging and holding the chip 110 during handling. Alternatively or additionally, the base 116 may incorporate a plurality of vacuum holes or vacuum heads for holding the chip 110.

Figure 12:
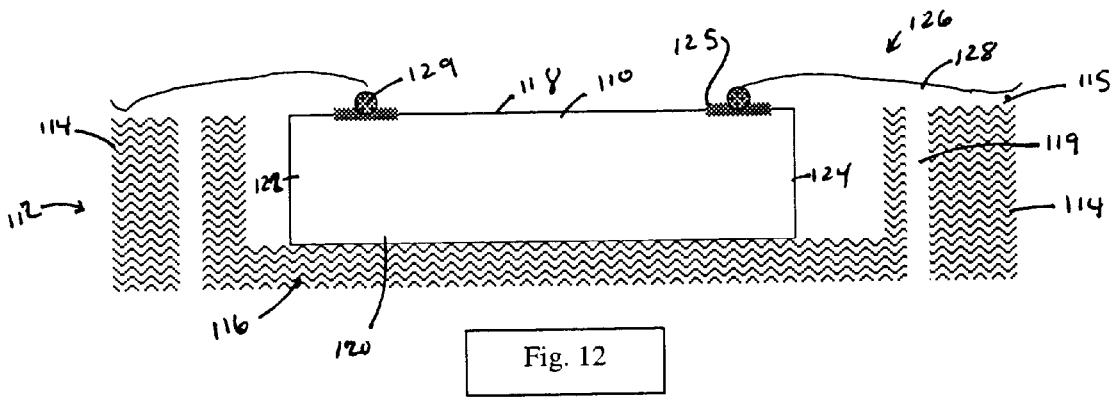
FIG. 12 is the cross-sectional view of FIG. 11, at a later stage in the method.

As shown in FIG. 12, leads 126 are attached to the contacts 125 and the upper surface 115 of the stage 112 so that the leads 126 extend over the conduits 119 in the stage 112. The leads 126 preferably comprise wire bonding wires 128.

Figure 13:
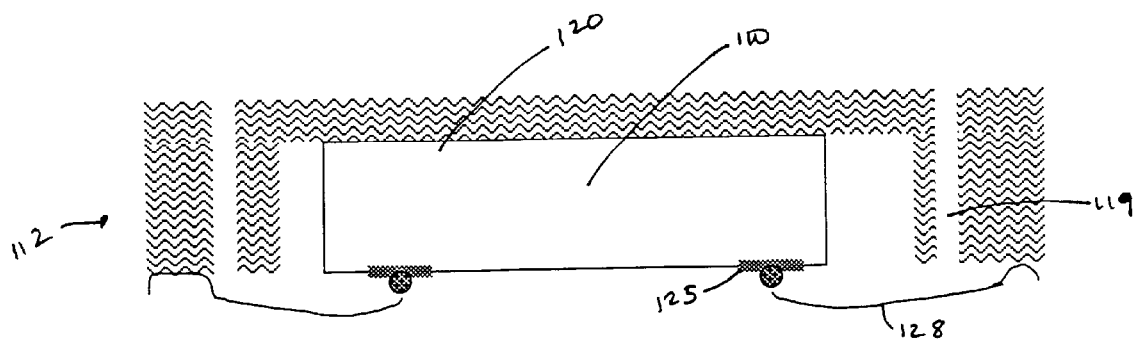
FIG. 13 is a schematic, cross-sectional view of a microelectronic element and microelectronic component in the method of FIGS. 11–12.
Figure 13:
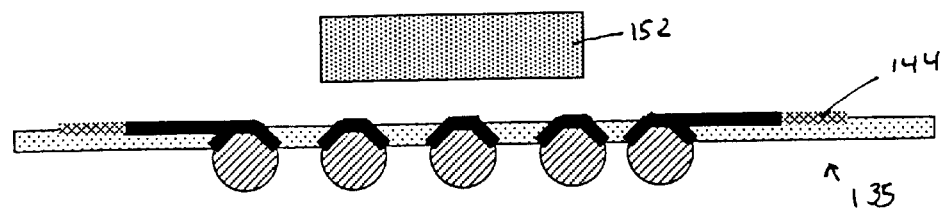

The stage 112 is utilized to juxtapose the chip 110 with respect to a microelectronic component 135, as shown in FIG. 13. The stage 112 is attached to robotic handling equipment for moving and positioning the stage 112 so that the chip is aligned with the component 135 and the wires 128 are aligned with the terminal pads 144 on the component 135.

Figure 14:
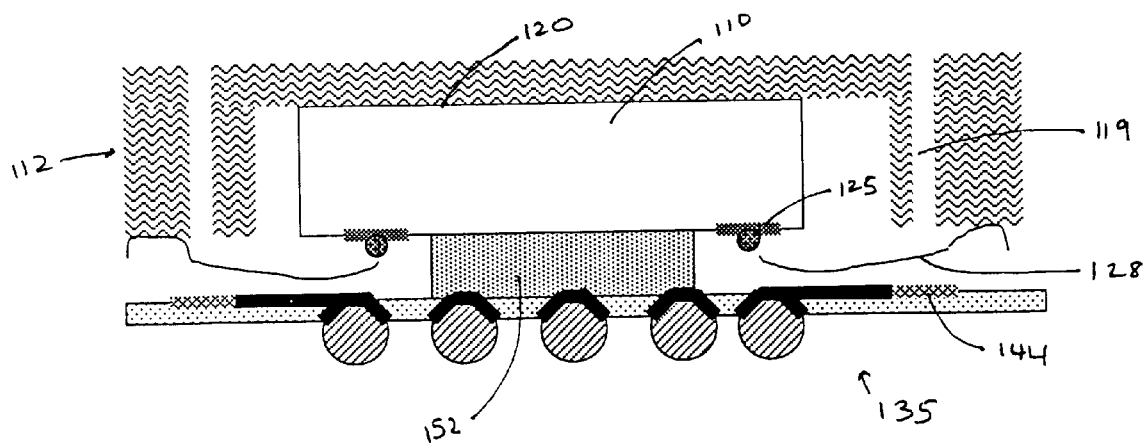
FIG. 14 is the cross-sectional view of FIG. 13, at a later stage in the method.

Preferably, a pad element 152 is interposed between the chip 110 and component 135. In interposing the pad element 152, the pad element may be formed on, or applied to, the chip 110 or component 135. The chip 110, component 135 and pad element 152 are then assembled together so that the wires 128 are aligned with the terminal pads 144 of the component 135, as shown in FIG. 14.

Figure 15:
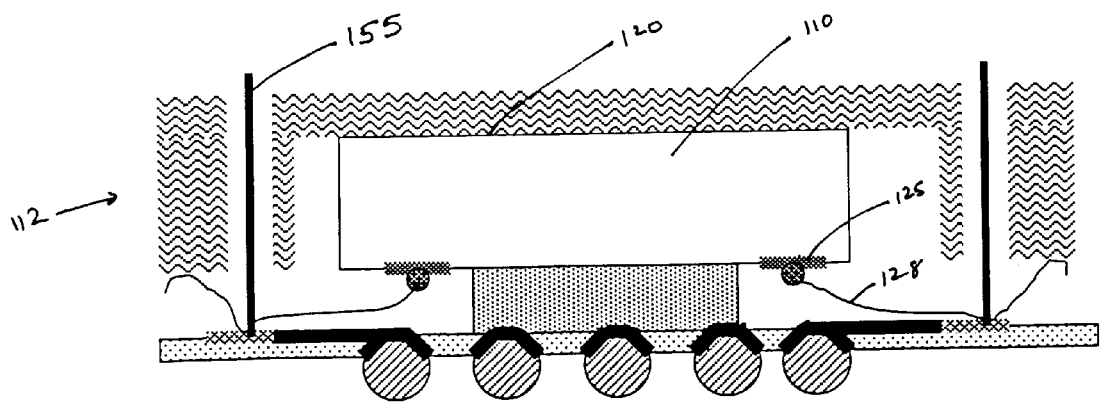
FIG. 15 is the cross-sectional view of a FIG. 14, at a later stage in the method.

The conduits 119 are then used in bonding the wires 128 to the terminal pads 144 on the component 135. A bonding tool 155 is introduced through the conduits 119 in the stage 112 and advanced toward the wires 128 at upper surface 115. The bonding tool 155 displaces a portion of each wire 128 toward a terminal pad 144 and bonds the wire 128 to the terminal pad 144 utilizing bonding energy, such as heat and/or ultrasonic vibration. (FIG. 15). One continuous conduit running adjacent the wires 128 may be utilized as an alternative to the pair of conduits 119 shown in FIGS. 1–16. Such conduits enable the stage 112 to be utilized for handling the chip 110 during the various steps in the method of making a microelectronic assembly. The conduits permit access to the wires 128 while the stage 112 holds the chip 110 in place.

Figure 16:
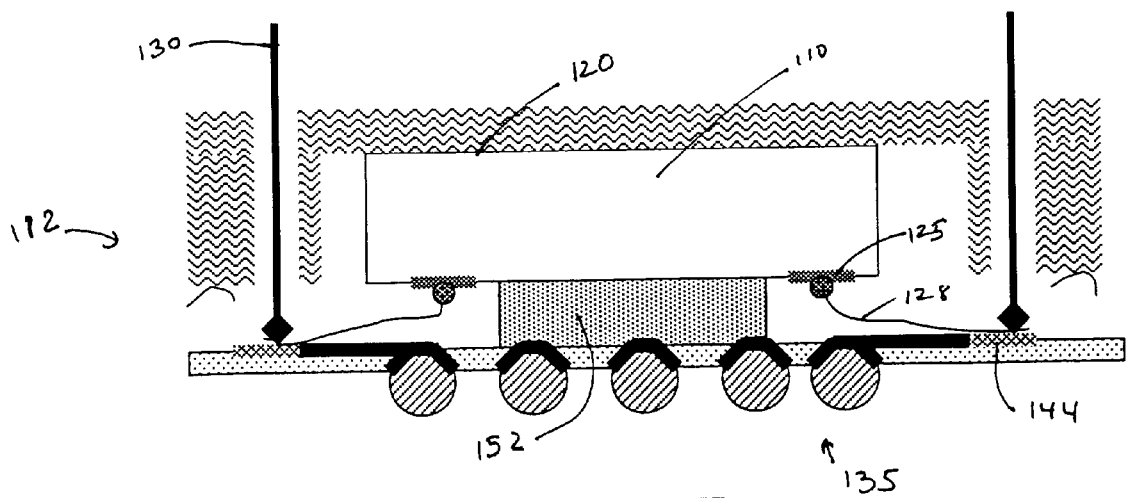
FIG. 16 is the cross-sectional view of a FIG. 15, at a later stage in the method.

Preferably, the wires 128 are severed from the upper surface 115 of the stage 112 after the chip 110 and component 135 are assembled so that the likelihood that the wires 128 become damaged in handling the chip 110 is reduced. As shown in FIG. 16, the wires 128 are separated from the upper surface 115 of the stage 112 by cutting the wires 128 with a cutting tool 130. In cutting the wires 128, the portion of the wires 128 that extends to the contacts is severed from the portion of the wires 128 that extends to the stage 112.

FIG. 16 shows the cutting tool 130 being introduced through the conduits 119 so that the cutting tool can gain access to the wires 118 while the stage 112 holds the chip 110. The cutting tool may comprise a blade or a pair of scissor-like blades. Alternatively, the wires may be severed from the upper surface 115 of the stage 112 by flaming off the portion of the wire 128 extending to the surface 115 from the portion of the wire 128 extending to the contact 125.

Figure 17:
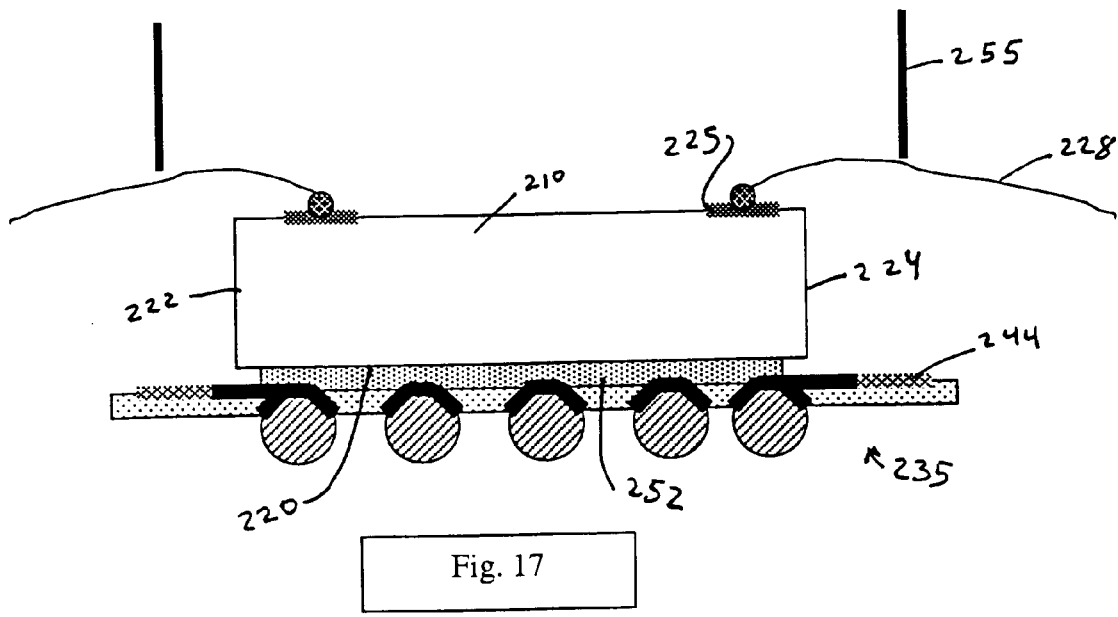
FIG. 17 is a schematic, cross-sectional view of a microelectronic element and microelectronic component in a method in accordance with a further embodiment of the invention.
Figure 18:
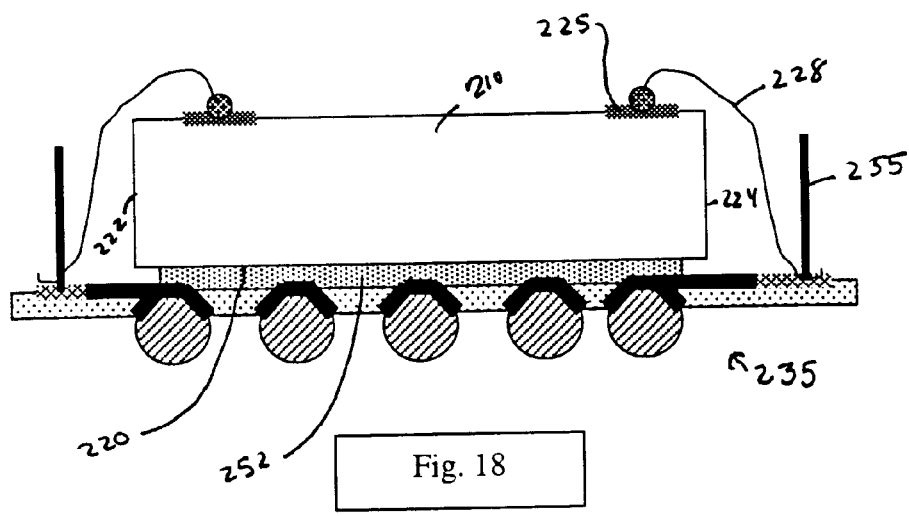
FIG. 18 is the cross-sectional view of FIG. 17, at a later stage in the method.

In a further embodiment of the invention, the microelectronic element or chip 210 is assembled with the microelectronic component 235 so that the second surface 220 faces the component 235. As shown in FIG. 17, the second surface 220 of the chip 210 is attached to the pad element 252 so that the contacts 225 face away from the component 235. The wires 228 are bonded to the terminal pads 244 using a bonding tool 255, as shown in FIGS. 17 and 18. It may be necessary to make the wires 228 longer than in the embodiments discussed above, so that the wires 228 extend downwardly alongside the peripheral edges 222 and 224 of the chip 210, to the terminal pads 244.

Figure 19:
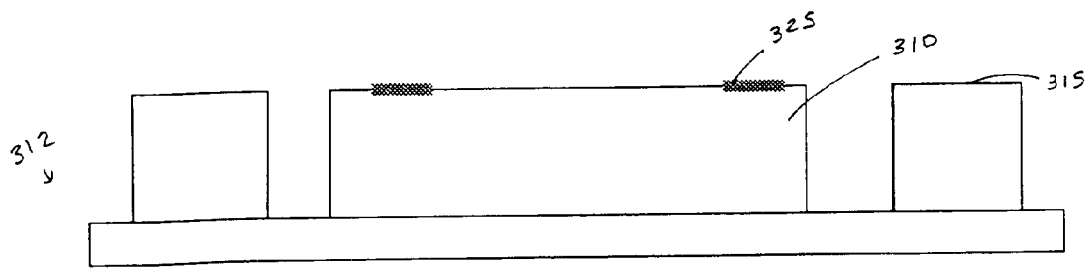
FIG. 19 is a schematic, cross-sectional view of a microelectronic element disposed in a stage in a method in accordance with a further embodiment of the invention.
Figure 20:
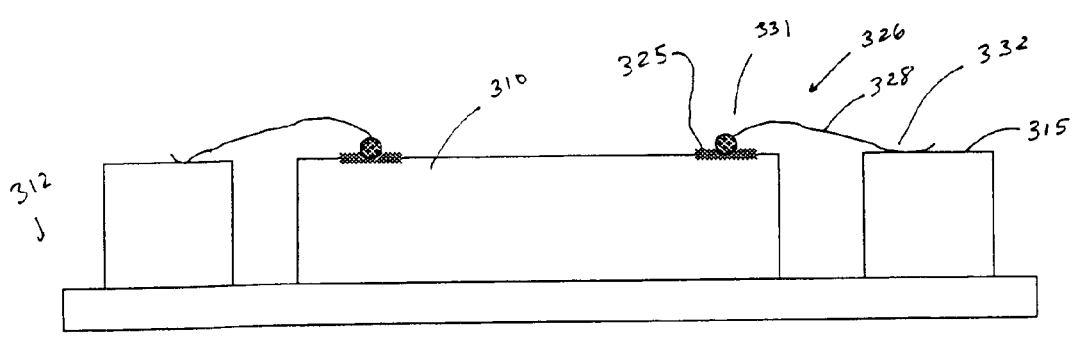
FIG. 20 is the cross-sectional view of FIG. 19, at a later stage in the method.
Figure 21:
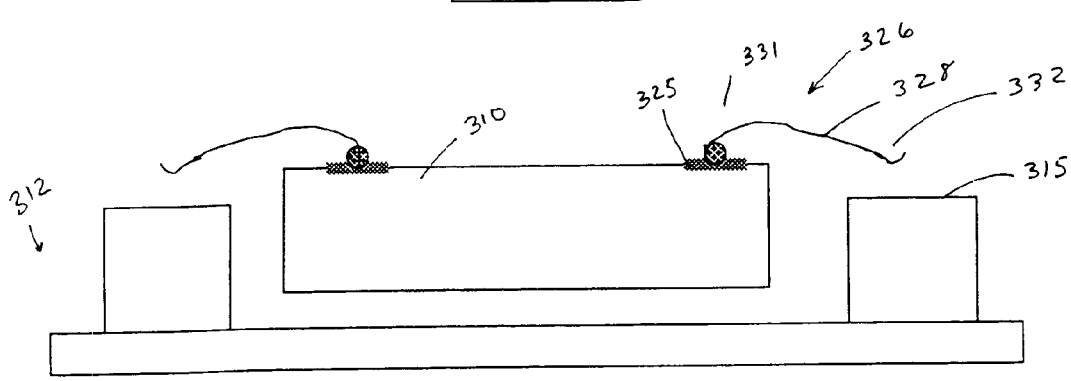
FIG. 21 is the cross-sectional view of FIG. 20, at a later stage in the method.

In a further embodiment of the invention, the leads are not disconnected from the stage by severing one portion of the lead from another portion of the lead. As shown in FIG. 19, a microelectronic element 310 is mounted in a stage 312 and leads 326, which may comprise wires 328 formed by wire bonding, are connected to contacts 325 of the microelectronic element 310 at a first end 331 of the wires 328 and connected to the stage 312 at a second end 332 of the wires 328. Preferably, the second end 332 of the wires 328 are connected to an upper surface 315 of the stage 312. It is also preferred that the second end 332 is releasably connected to the upper surface 315. For example, upper surface 315 may comprise a non-stick surface 317 so that the second end 332 of the wires is releasable from the upper surface 317. As shown in FIG. 21, the microelectronic element 310 is removed from the stage 312 utilizing a pick and place machine, or other robotic equipment for handling microelectronic parts. As the microelectronic element 310 is removed from the stage 312, the wires 328 become detached from the upper surface 315. The microelectronic element is 310 then juxtaposed with a component, as discussed above.

These and other variations and combinations of the features discussed above can be utilized without departing from the invention. For example, the wires may be crimped by a tool and then severed during bonding to the terminal pads on the microelectronic component. In addition, connection components other than the components discussed above may be used to form a microelectronic assembly in accordance with embodiments of the invention. Further, the leads may comprise leads other than the bonding wires discussed above. Thus, the foregoing description of the preferred embodiments should be taken by way of illustration rather than by way of limitation of the invention as defined by the claims.

What is claimed is:

1. A method of making a microelectronic assembly, comprising:
   a) connecting a first end of a lead to a contact on a microelectronic element;
   b) connecting a second end of said lead to a stage disposed adjacent to said microelectronic element;
   c) juxtaposing said microelectronic element with a microelectronic component having terminal pads exposed at a first side of said microelectronic component;
   d) disconnecting said lead from said stage, either before or after said juxtaposing; and
   e) bonding said lead to one of said terminal pads.

2. The method of claim 1, wherein said lead comprises a wire having a first end and a second end, said wire being formed by wire bonding said first end to said contact, extending said wire past a peripheral edge of said microelectronic element and bonding said second end of said wire to said stage.

3. The method of claim 1, further comprising assembling said microelectronic element with said microelectronic component.

4. The method of claim 3, further comprising assembling at least one pad element with said microelectronic element and said microelectronic component so that said at least one pad element is disposed between said microelectronic element and said microelectronic component.

5. The method of claim 4, wherein said at least one pad element comprises a compliant pad element.

6. The method of claim 1, wherein said microelectronic element comprises at least one semiconductor chip.

7. The method of claim 1, further comprising making said microelectronic component by forming said terminal pads on a first side of a dielectric layer, forming conductive traces on said first side, and forming connection terminals on a second side of said dielectric layer so that said terminal pads are electrically connected to said connection terminals by said conductive traces.

8. The method of claim 7, further comprising applying solder at said second side of said dielectric layer to form said connection terminals.

9. The method of claim 1, wherein said lead is disconnected from said stage by severing a portion of said lead connected to said contact from another portion of said lead connected to said stage.

10. The method of claim 1, wherein said lead is releasably connected to said stage and is disconnected from said stage by removing said microelectronic element from said stage.

11. The method of claim 10, wherein said lead is connected to an upper surface of said stage and said upper surface comprises a non-stick surface.

12. The method of claim 1, wherein said bonding of said lead to said terminal pad includes displacing said lead in a direction toward said terminal pad utilizing a bonding tool.

13. The method of claim 1, wherein said stage has a first surface and includes a conduit being open on said first surface.

14. The method of claim 13, wherein said second end of said lead is bonded to said first surface so that said lead extends over said conduit.

15. The method of claim 14, wherein said lead is disconnected by inserting a cutting tool into said conduit and severing a portion of said lead connected to said contact from another portion of said lead connected to said stage.

16. The method of claim 14, wherein said lead is bonded to said terminal pad by inserting a bonding tool into said conduit, displacing said lead in a direction toward said terminal pad and bonding said lead to said terminal pad.

17. The method of claim 1, wherein said microelectronic element is mounted to said stage and said microelectronic element is juxtaposed with said microelectronic component by moving said stage to said microelectronic component.

18. The method of claim 1, wherein:
a) said microelectronic element has a first surface and a second surface facing oppositely from said first surface and said contacts are exposed at said first surface;
b) said microelectronic element is juxtaposed with said microelectronic component so that said first surface faces said first side of said microelectronic component.

19. The method of claim 1, wherein:
a) said microelectronic element has a first surface and a second surface facing oppositely from said first surface and said contacts are exposed at said first surface;
b) said microelectronic element is juxtaposed with said microelectronic component so that said second surface faces said first side of said microelectronic component.

20. A method of forming a microelectronic assembly, comprising:
a) connecting a first end of a wire to a contact on a microelectronic element having peripheral edges;
b) extending said wire beyond said peripheral edges of said microelectronic element;
c) connecting a second end of said wire to a stage disposed adjacent to said microelectronic element;
d) assembling said microelectronic element with a microelectronic component having a first side and a second side, said first side having terminal pads exposed at said first side and said second side having connection terminals exposed at said second side, each said connection terminal being electrically connected to one of said terminal pads;
e) disconnecting said wire from said stage, either before or after said assembling; and
f) bonding said wire to one of said terminal pads.

21. The method of claim 20, further comprising assembling at least one pad element with said microelectronic element and said microelectronic component so that said at least one pad element is disposed between said microelectronic element and said microelectronic component.

22. The method of claim 21, wherein said at least one pad element comprises a compliant pad element.

23. The method of claim 20, wherein said microelectronic element comprises at least one semiconductor chip.

24. The method of claim 20, wherein said wire is disconnected from said stage by severing a portion of said wire connected to said contact from another portion of said wire connected to said stage.

25. The method of claim 20, wherein said stage has a first surface and includes a conduit being open on said first surface and said second end of said wire is bonded to said first surface so that said wire extends over said conduit.

26. The method of claim 25, wherein said wire is bonded to said terminal pad by inserting a bonding tool into said conduit, displacing said wire in a direction toward said terminal pad and bonding said wire to said terminal pad.

27. The method of claim 20, wherein said microelectronic element is mounted to said stage and said microelectronic element is juxtaposed with said microelectronic component by moving said stage to said microelectronic component.

* * * * *